(12) United States Patent
Liu et al.

(10) Patent No.: US 8,487,311 B2
(45) Date of Patent: Jul. 16, 2013

(54) PIXEL STRUCTURE

(75) Inventors: Chun-Yen Liu, Hsinchu County (TW); Cheng-Chieh Tseng, Hsinchu County (TW); Chia-Yuan Yeh, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/365,221

(22) Filed: Feb. 2, 2012

(65) Prior Publication Data

US 2012/0313100 A1    Dec. 13, 2012

(30) Foreign Application Priority Data

Jun. 10, 2011    (TW) .............................. 100120435 A

(51) Int. Cl.
*H01L 29/786*    (2006.01)
(52) U.S. Cl.
USPC ..................... 257/59; 257/72; 257/E29.273
(58) Field of Classification Search
USPC ........... 257/43, 59, 71, 72, E29.273, E21.409
See application file for complete search history.

(56) References Cited

U.S. PATENT DOCUMENTS

| 7,176,989 | B2 | 2/2007 | Takahara et al. |
| 7,612,377 | B2 | 11/2009 | Moon et al. |
| 7,893,440 | B2 | 2/2011 | Kwon et al. |
| 2009/0278131 | A1 | 11/2009 | Kwon et al. |
| 2010/0230763 | A1* | 9/2010 | Sun et al. ...................... 257/390 |
| 2012/0146487 | A1* | 6/2012 | Kim .............................. 313/504 |

FOREIGN PATENT DOCUMENTS

CN    101577283    11/2009

OTHER PUBLICATIONS

"First Office Action of China Counterpart Application", issued on Dec. 5, 2012, p1-p4, in which the listed reference (CN101577283) was cited.

* cited by examiner

*Primary Examiner* — Victor A Mandala
*Assistant Examiner* — Whitney T Moore
(74) *Attorney, Agent, or Firm* — Jianq Chyun IP Office

(57) ABSTRACT

A pixel structure including a semiconductor layer having at least one source region and at least one drain region; a first insulating layer covering the semiconductor layer; a first conductive layer on the first insulating layer and including at least one gate; a second insulating layer covering the first conductive layer; a second conductive layer on the second insulating layer and including at least one source electrode, at least one drain electrode and at least one bottom electrode, the source region, the source electrode, the drain region, the drain electrode and the gate forming at least one thin film transistor; a third insulating layer covering the second conductive layer; a third conductive layer on the third insulating layer and including at least one top electrode, the top electrode and the bottom electrode forming at least one capacitor; and a pixel electrode electrically connected to the thin film transistor.

4 Claims, 16 Drawing Sheets

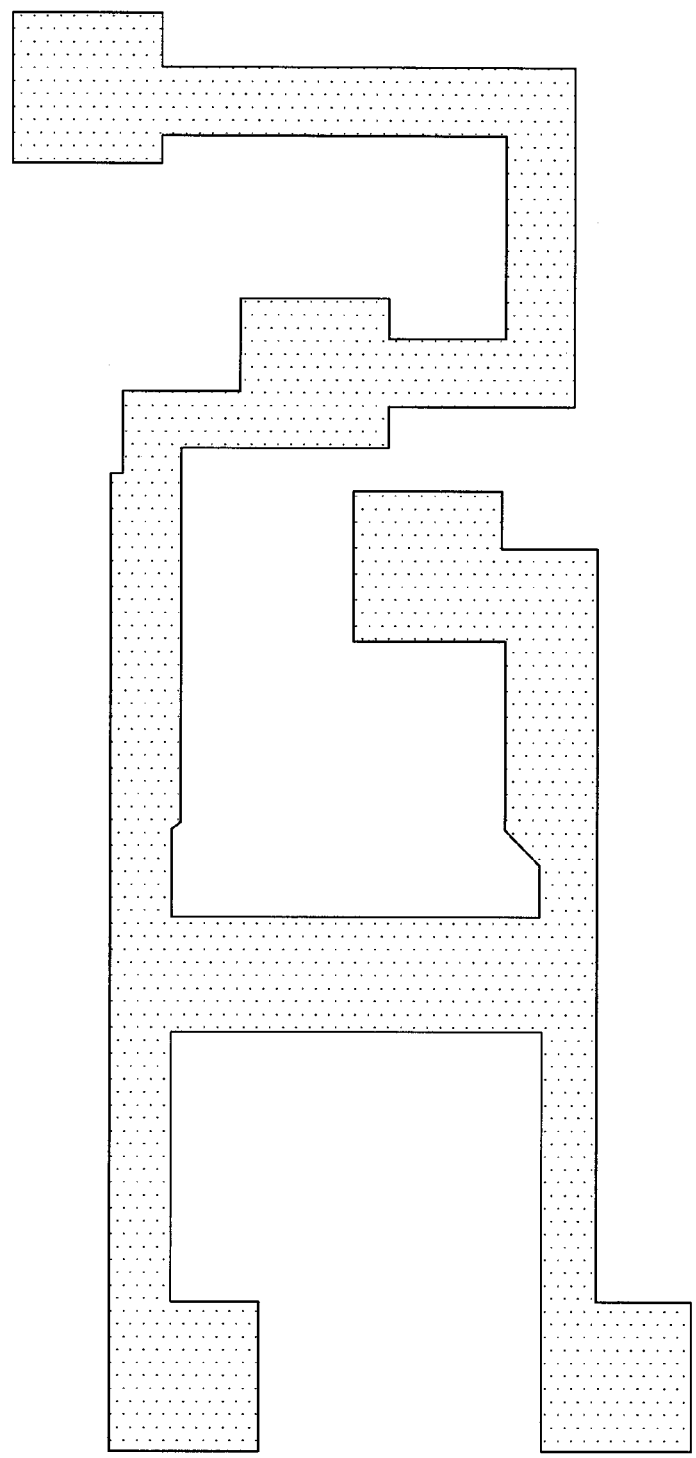
FIG. 3A  PO

PIXEL STRUCTURE

CROSS-REFERENCE TO RELATED APPLICATION

This application claims the priority benefit of Taiwan application serial no. 100120435, filed on Jun. 10, 2011. The entirety of the above-mentioned patent application is hereby incorporated by reference herein and made a part of this specification.

BACKGROUND OF THE INVENTION

1. Field of the Invention

The present invention relates to a semiconductor device. More particularly, the present invention relates to a pixel structure.

2. Description of Related Art

An organic light emitting device is a self-illuminating light emitting device. Displays adopting organic light emitting devices have no limitation in viewing angle, low fabrication cost, high responding speed (about 100 times faster than that of liquid crystals), low power consumption, application in portable devices, wide operation temperature range, and light weight. Moreover, these displays can be miniaturized as required by hardware apparatuses. Thus, the displays adopting organic light emitting devices have high potential in development and may become flat panel displays of the next generation.

A pixel structure of the organic light emitting device in the display is usually driven by the cooperation of a plurality of thin film transistors (TFTs) and a capacitor. However, since the plurality of TFTs is used in the pixel circuit structure, the TFTs must have occupied a certain area in the pixel structure. The pixel circuit structure consequently has no extra space for disposing other components. Or, the pixel circuit structure can not be miniaturized easily and thus can not be applied in displays with high resolution.

SUMMARY OF THE INVENTION

Accordingly, the present invention is directed to a pixel structure capable of reducing an area occupied by components of the pixel structure.

The present invention provides a pixel structure comprising a semiconductor layer, a first insulating layer, a first conductive layer, a second insulating layer, a second conductive layer, a third insulating layer, a third conductive layer, and a pixel electrode. The semiconductor layer comprises at least one source region and at least one drain region. The first insulating layer covers the semiconductor layer. The first conductive layer is disposed on the first insulating layer and includes at least one gate. The second insulating layer covers the first conductive layer. The second conductive layer is disposed on the second insulating layer and includes at least one source electrode, at least one drain electrode and at least one bottom electrode, wherein the at least one source electrode and the at least one drain electrode are electrically connected to the at least one source region and the at least one drain region, and the at least one source region, the at least one source electrode, the at least one drain region, the at least one drain electrode and the at least one gate form at least one thin film transistor. The third insulating layer covers the second conductive layer. The third conductive layer is disposed on the third insulating layer and includes at least one top electrode, wherein the at least one top electrode of the third conductive layer and the at least one bottom electrode of the second conductive layer form at least one capacitor. The pixel electrode is electrically connected to the at least one thin film transistor.

The present invention provides a pixel structure comprising a semiconductor layer, a first insulating layer, a first conductive layer, a second insulating layer, a second conductive layer, a third insulating layer, a third conductive layer, and a pixel electrode. The semiconductor layer comprises at least one source region, at least one drain region, at least one channel region and at least one first electrode. The first insulating layer covers the semiconductor layer. The first conductive layer is disposed on the first insulating layer and includes at least one gate and at least one second electrode, wherein the at least one gate is disposed above the at least one channel region, and the at least one second electrode is disposed above the at least one first electrode. The second insulating layer covers the first conductive layer. The second conductive layer is disposed on the second insulating layer and includes at least one third electrode located above the at least one second electrode, wherein the at least one first electrode of the semiconductor layer, the at least one second electrode of the first conductive layer, and the at least one third electrode of the second conductive layer form at least one capacitor. The third insulating layer covers the second conductive layer. The third conductive layer is disposed on the third insulating layer and includes at least one source electrode and at least one drain electrode, wherein the at least one source electrode and the at least one drain electrode are electrically connected to the at least one source region and the at least one drain region respectively, and the at least one source region, the at least one source electrode, the at least one drain region, the at least one drain electrode, the at least one channel and the at least one gate form at least one thin film transistor. The pixel electrode is electrically connected to the at least one thin film transistor.

In light of the foregoing, in one embodiment of the present invention, the capacitor is formed with the second conductive layer and the third conductive layer, and therefore the capacitor can be disposed overlapping with the semiconductor layer, so as to educe an area occupied by components of the pixel structure. According to another embodiment of the present invention, the capacitor is formed with the semiconductor layer, the first conductive layer and the second conductive layer, and the area occupied by the capacitor can be reduced on the premise that a predetermined capacitance is maintained, such that an overall area of the pixel structure can also be reduced.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIG. 3A is a top view showing a semiconductor layer of the pixel structure in FIG. 2.

DESCRIPTION OF EMBODIMENTS

First Embodiment

Figure 1:
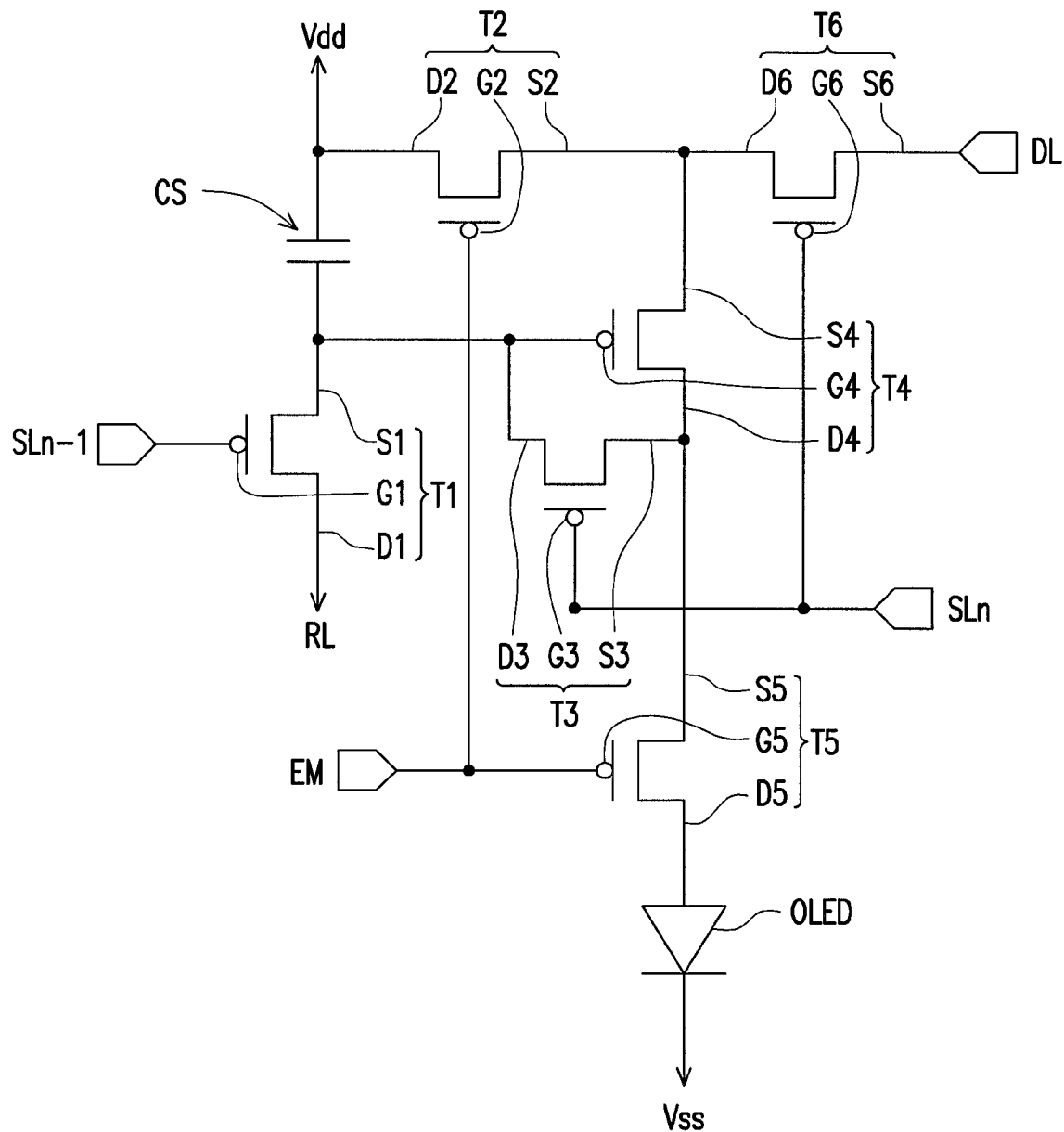
FIG. 1 is a schematic circuit diagram of a pixel structure according to an embodiment of the invention.
Figure 2:
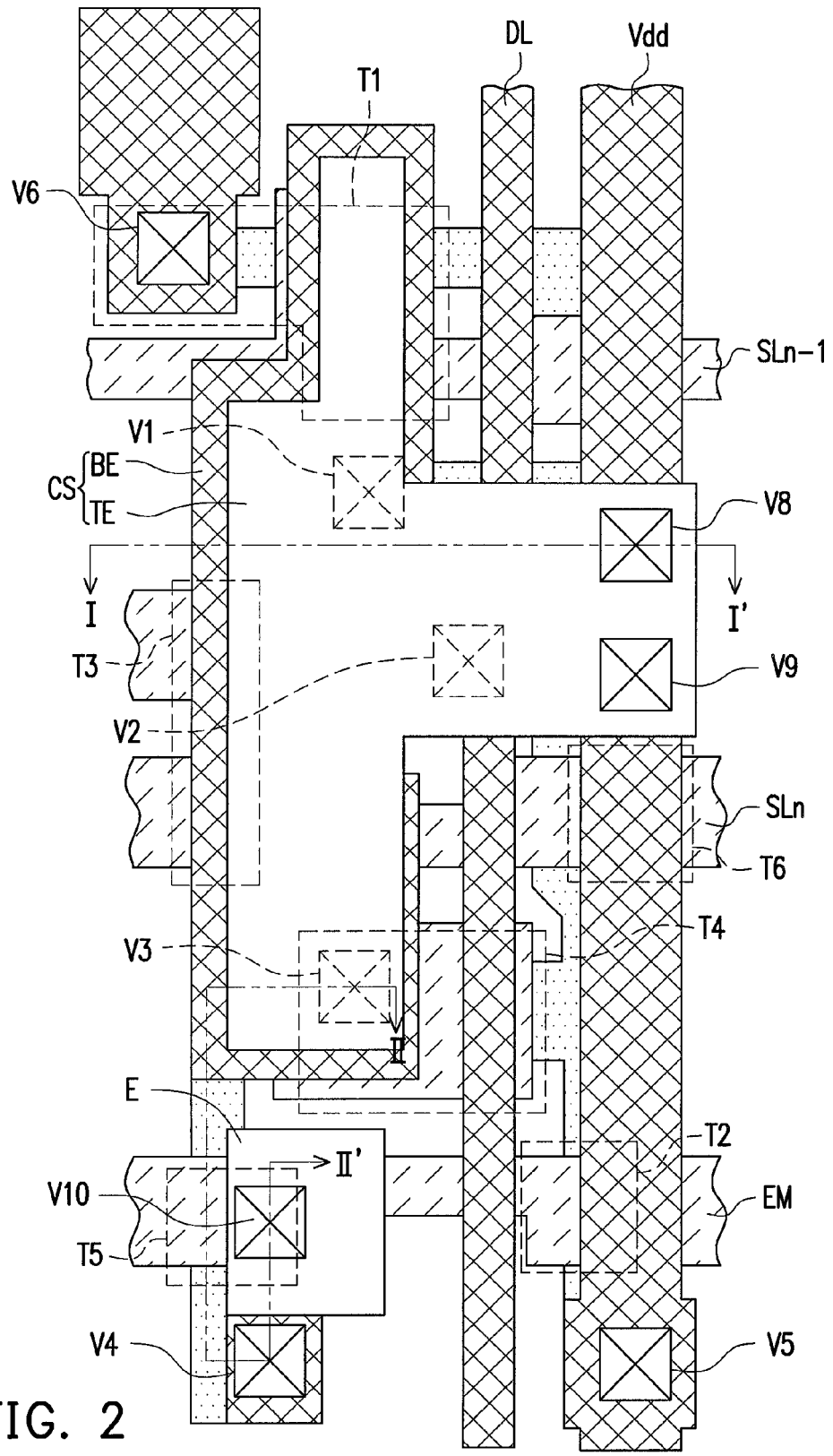
FIG. 2 is a top view showing a pixel structure according to an embodiment of the invention.
Figure 3B:
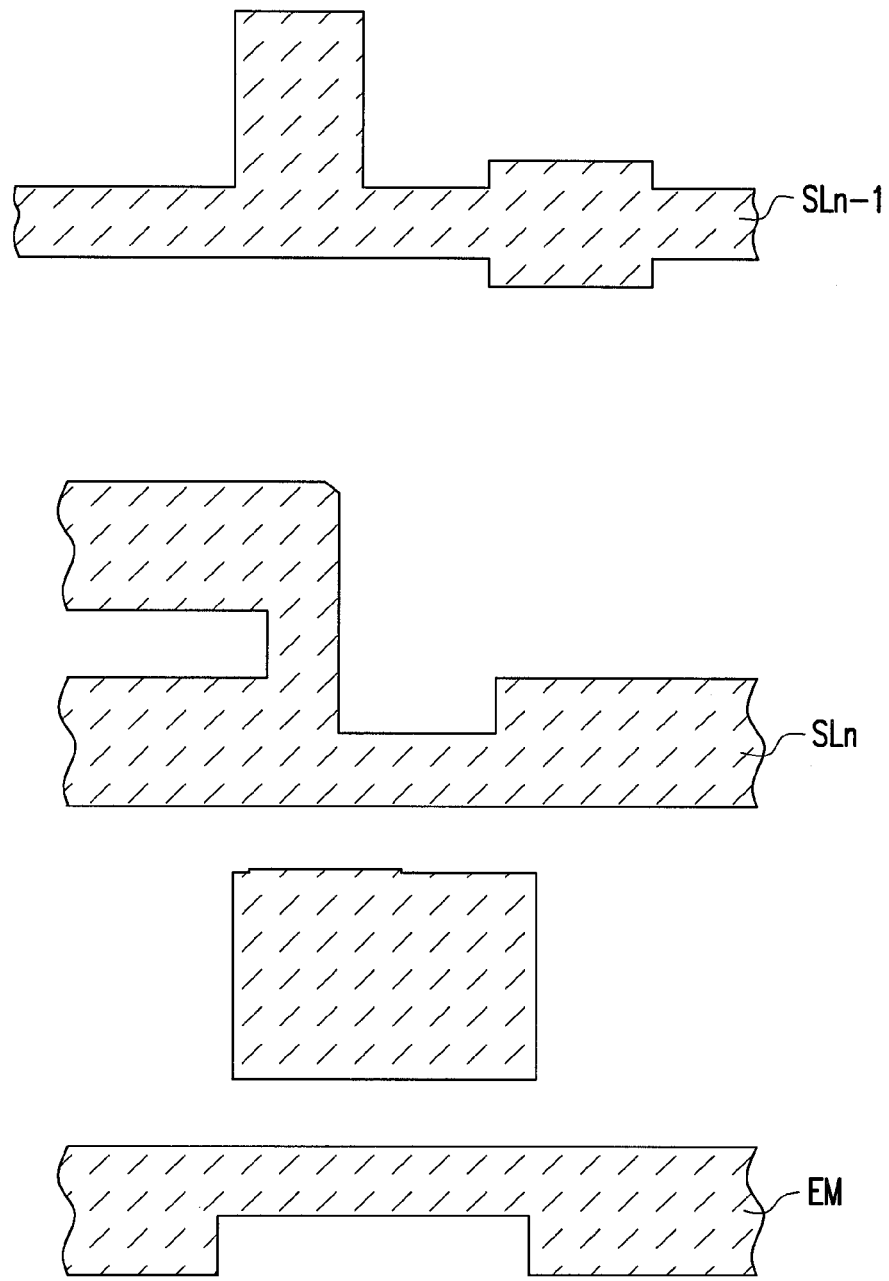
FIG. 3B is a top view showing a first conductive layer of the pixel structure in FIG. 2.
Figure 3C:
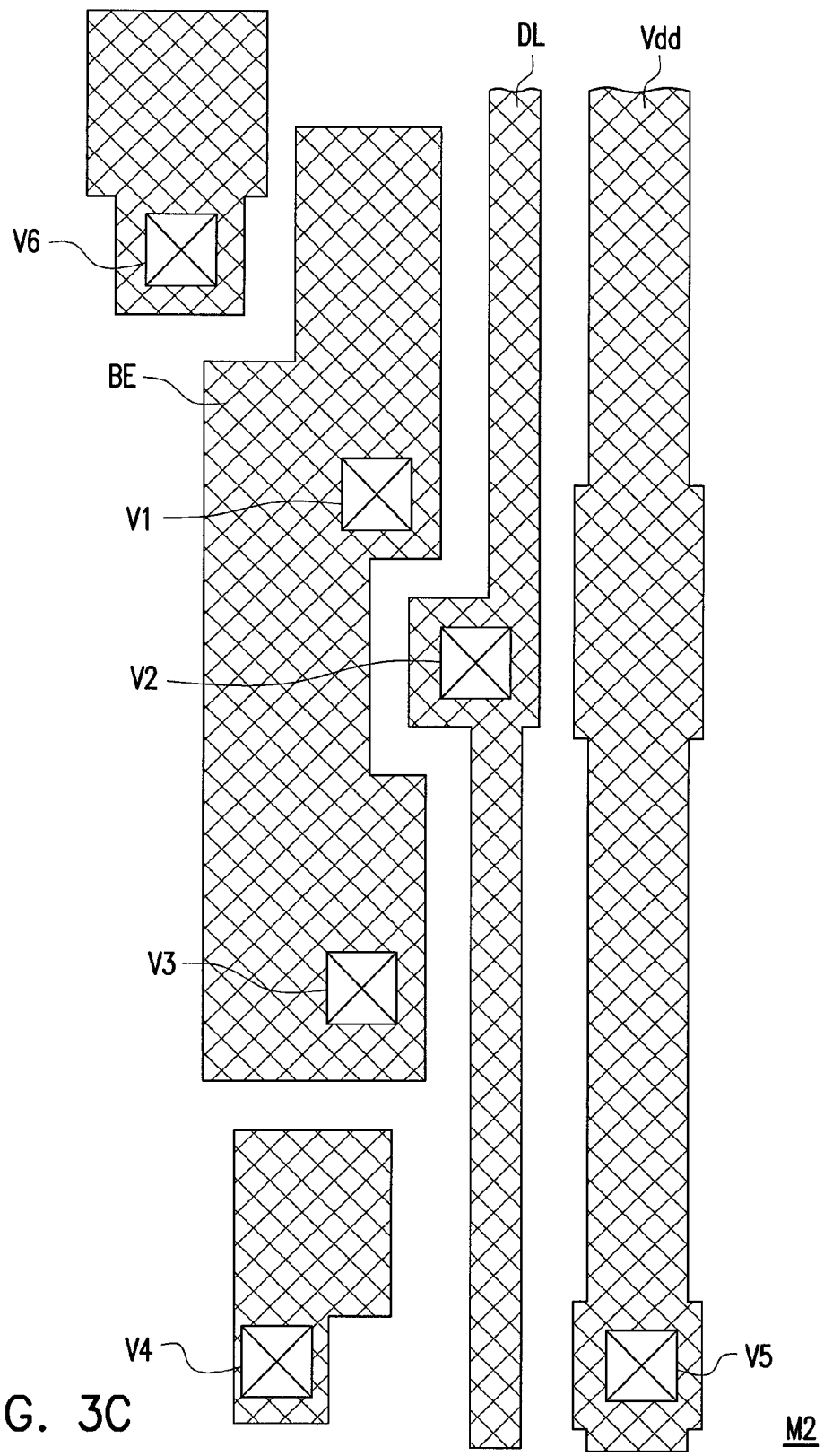
FIG. 3C is a top view showing a second conductive layer of the pixel structure in FIG. 2.
Figure 3D:
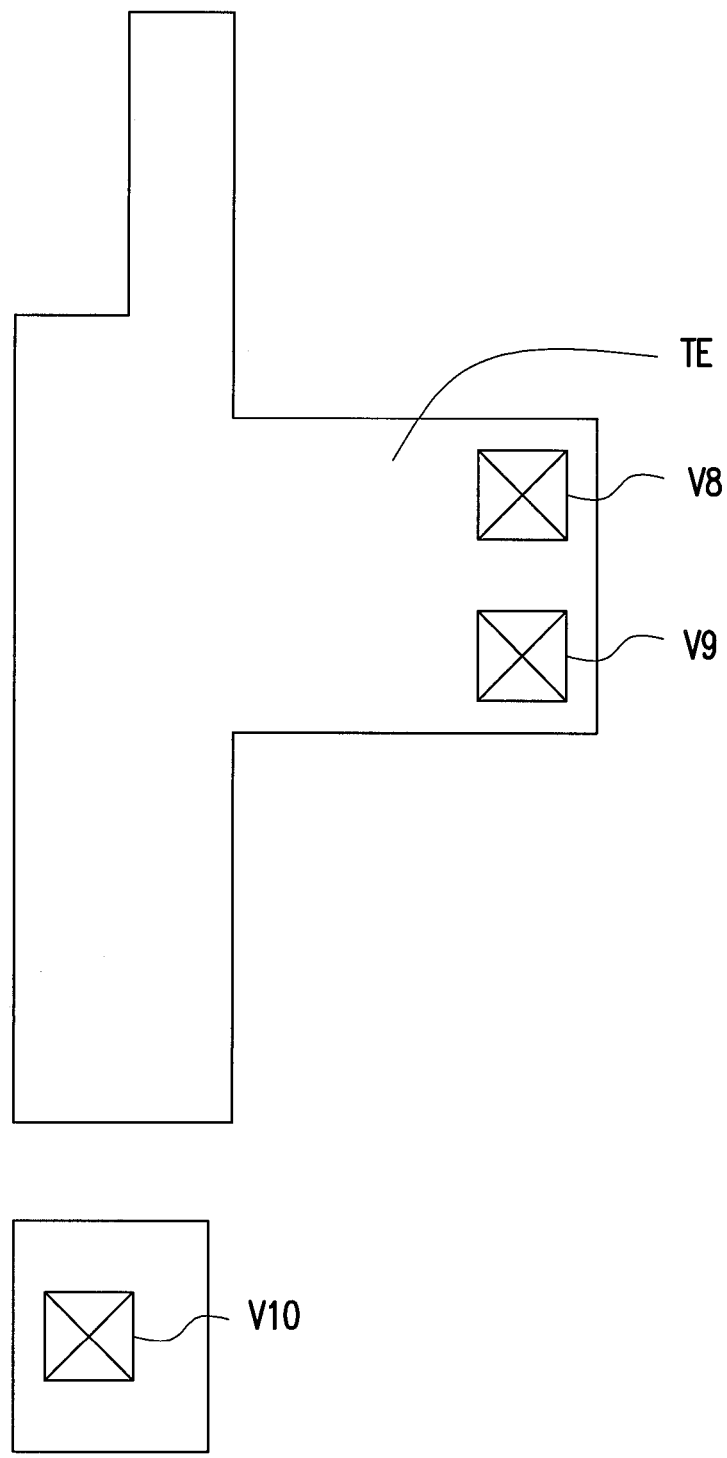
FIG. 3D is a top view showing a third conductive layer of the pixel structure in FIG. 2.
Figure 5:
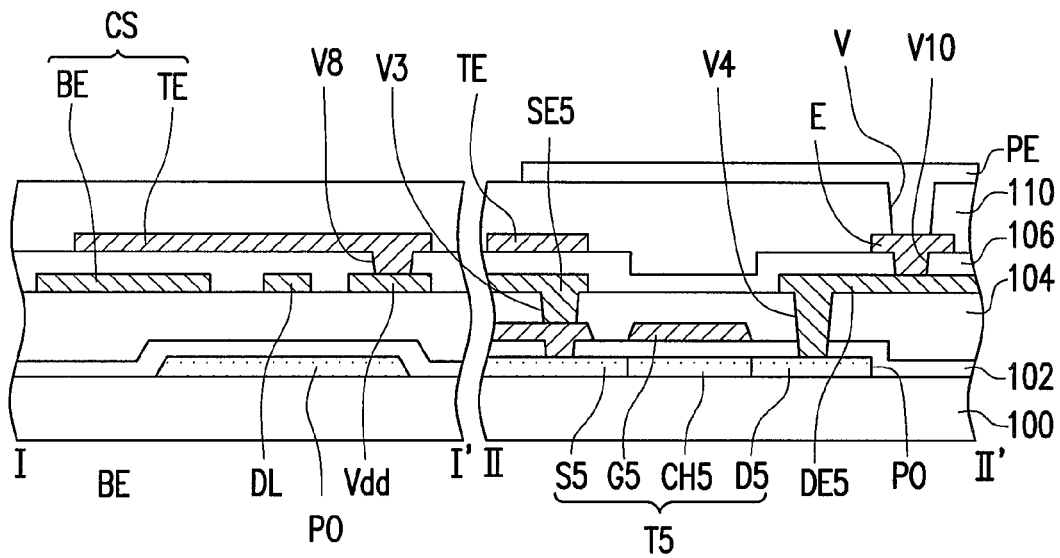
FIG. 5 is schematic cross-sectional diagram along the cross-sectional line I-I' and the cross-sectional line II-II' in FIG. 2.

FIG. 1 is a schematic circuit diagram of a pixel structure according to an embodiment of the invention. FIG. 2 is a top view showing a pixel structure according to an embodiment of the invention. FIG. 5 is schematic cross-sectional diagram along the cross-sectional line I-I' and the cross-sectional line II-II' in FIG. 2. FIG. 3A is a top view showing a semiconductor layer of the pixel structure in FIG. 2. FIG. 3B is a top view showing a first conductive layer of the pixel structure in FIG. 2. FIG. 3C is a top view showing a second conductive layer of the pixel structure in FIG. 2. FIG. 3D is a top view showing a third conductive layer of the pixel structure in FIG. 2.

Referring to FIG. 1, FIG. 2, FIG. 3A, FIG. 3B, FIG. 3C, FIG. 3D and FIG. 5, the pixel structure is disposed on a substrate 100 and comprises a semiconductor layer PO, a first insulating layer 102, a first conductive layer, M1 a second insulating layer 104, a second conductive layer M2, a third insulating layer 106, a third conductive layer M3 and a pixel electrode PE. In the embodiment, the pixel structure is applied to an organic electroluminescence display and has a structure comprising six thin film transistors and one capacitor (6T1C), which should not be construed as a limitation to the invention. According to another embodiment, the pixel structure may also be a 1T1C structure, a 2T1C structure or other structures including a specific number of transistor and a specific number of capacitor, and the pixel structure may be applied to other displays, such as a liquid crystal display, an electrophoretic display, an electro-wetting display or other suitable displays. In addition, the cross-sectional diagram of FIG. 5 is a cross-sectional view for the fifth thin film transistor in the 6T1C pixel structure. Since the six thin film transistors in the 6T1C pixel structure are substantially similar, the people skilled in the art may understand the cross-sectional structures of other five thin film transistors in accordance with the description for the fifth thin film transistor shown in FIG. 5.

The substrate 100 can be made of glass, quartz, an organic polymer, an opaque/reflective material (such as a conductive material, metal, wafer, ceramics, or any other appropriate material), or any other appropriate material. An additional insulating layer or buffer layer (not shown) may also be formed on the substrate 100.

The semiconductor layer PO is disposed on the substrate 100 and can be made of amorphous silicon, polysilicon, micro-silicon, mono-silicon, an organic semiconductor material, an oxide semiconductor material (e.g., indium zinc oxide, indium germanium zinc oxide, any other suitable material, or a combination of the above), any other suitable material, the aforesaid material having dopant, or a combination of the above. The semiconductor layer PO comprises at least one source region and at least one drain region, and a region between the source region and the drain region is a channel region. According to the embodiment, the layout of the semiconductor layer PO is shown in FIG. 3A, and the semiconductor layer PO mainly comprises channel regions, source regions and drain regions of the six thin film transistors.

In the embodiment, the semiconductor layer PO has a source region S5, a drain region D5 and a channel region CH5 in a region predetermined for forming a fifth thin film transistor T5. Similarly, the semiconductor layer PO has a source region S1, a drain region D1 and a channel region (not shown) in a region predetermined for forming a first thin film transistor T1; the semiconductor layer PO has a source region S2, a drain region D2 and a channel region (not shown) in a region predetermined for forming a second thin film transistor T2; the semiconductor layer PO has a source region S3, a drain region D3 and a channel region (not shown) in a region predetermined for forming a third thin film transistor T3; the semiconductor layer PO has a source region S4, a drain region D4 and a channel region (not shown) in a region predetermined for forming a fourth thin film transistor T4; and the semiconductor layer PO has a source region S6, a drain region D6 and a channel region (not shown) in a region predetermined for forming a sixth thin film transistor T6.

The first insulating layer 102 covers the semiconductor layer PO. The first insulating layer 102 can be made of an inorganic material (such as silicon oxide, silicon nitride, or silicon oxynitride), an organic material or a stacked layer containing the insulating material and any other insulating material.

The first conductive layer M1 is disposed on the first insulating layer 102. In consideration of electrical conductivity, the first conductive layer M1 is often made of metal materials. However, the invention is not limited thereto. According to other embodiments of the invention, the first conductive layer M1 can also be made of other conductive materials. The metal material includes, for example, an alloy, metal nitride, metal oxide, metal oxynitride, another appropriate material, or a layer in which the metal material and any other conductive material are stacked to each other. According to the embodiment, the layout of the first conductive layer M1 is shown in FIG. 3B, which mainly comprises gates of the six thin film transistors. For example, the first conductive layer M1 has a gate G5 in the region predetermined for forming the fifth thin film transistor T5.

Similarly, the first conductive layer M1 has a gate G1 in the region predetermined for forming the first thin film transistor T1; the first conductive layer M1 has a gate G2 in the region predetermined for forming the second thin film transistor T2;

the first conductive layer M1 has a gate G3 in the region predetermined for forming the third thin film transistor T3; the first conductive layer M1 has a gate G4 in the region predetermined for forming the fourth thin film transistor T4; and the first conductive layer M1 has a gate G6 in the region predetermined for forming the sixth thin film transistor T6. In addition, the first conductive layer M1 further comprises a scan line SLn, a scan line SLn-1 and a light emitting signal line EM, wherein the scan line SLn is electrically connected to the gate G3, the scan line SLn-1 is electrically connected to the gate G1, and the light emitting signal line EM is electrically connected to the gates G5, G2. Moreover, the first conductive layer M1 may further comprise a reference signal line RL (as shown in FIG. 1).

The second insulating layer 104 covers the first conductive layer M1. The second insulating layer 104 is a single-layer structure or a multi-layer structure, and the second insulating layer 104 may also be referred to a planarization layer. The second insulating layer 104 can be made of an inorganic material (such as silicon oxide, silicon nitride, or silicon oxynitride), an organic material or a stacked layer containing the insulating material and any other insulating material.

The second conductive layer M2 is disposed on the second insulating layer 104. In consideration of electrical conductivity, the second conductive layer M2 is often made of metal materials. However, the invention is not limited thereto. According to other embodiments of the invention, the second conductive layer M2 can also be made of other conductive materials. The metal material includes, for example, an alloy, metal nitride, metal oxide, metal oxynitride, another appropriate material, or a layer in which the metal material and any other conductive material are stacked to each other. According to the embodiment, the layout of the second conductive layer M2 is shown in FIG. 3C, which mainly comprises source electrodes and drain electrodes of the six thin film transistors and a bottom electrode of a capacitor. For example, the second conductive layer M2 has a source electrode SE5 and a drain electrode DE5 in the region predetermined for forming the fifth thin film transistor T5, the source electrode SE5 and the drain electrode DE5 are electrically connected to the source region S5 and the drain region D5 respectively, and the source region S5, the drain region D5, the source electrode SE5, the drain electrode DE5 and the gate G5 form the fifth thin film transistor T5.

Similarly, the second conductive layer M2 has a source electrode and a drain electrode (not shown) in the region predetermined for forming the first thin film transistor T1, the source electrode and the drain electrode are electrically connected to the source region S1 and the drain region D1 respectively, and the source region S1, the drain region D1, the source electrode, the drain electrode and the gate G1 form the first thin film transistor T1. The second conductive layer M2 has a source electrode and a drain electrode (not shown) in the region predetermined for forming the second thin film transistor T2, the source electrode and the drain electrode are electrically connected to the source region S2 and the drain region D2 respectively, and the source region S2, the drain region D2, the source electrode, the drain electrode and the gate G2 form the second thin film transistor T2. The second conductive layer M2 has a source electrode and a drain electrode (not shown) in the region predetermined for forming the third thin film transistor T3, the source electrode and the drain electrode are electrically connected to the source region S3 and the drain region D3 respectively, and the source region S3, the drain region D3, the source electrode, the drain electrode and the gate G3 form the third thin film transistor T3. The second conductive layer M2 has a source electrode and a drain electrode (not shown) in the region predetermined for forming the fourth thin film transistor T4, the source electrode and the drain electrode are electrically connected to the source region S4 and the drain region D4 respectively, and the source region S4, the drain region D4, the source electrode, the drain electrode and the gate G4 form the third thin film transistor T4. The second conductive layer M2 has a source electrode and a drain electrode (not shown) in the region predetermined for forming the sixth thin film transistor T6, the source electrode and the drain electrode are electrically connected to the source region S6 and the drain region D6 respectively, and the source region S6, the drain region D6, the source electrode, the drain electrode and the gate G6 form the sixth thin film transistor T6. The above source electrodes and the drain electrodes are electrically connected to the source region and the drain regions through contact via structures V1~V6.

Besides, the second conductive layer M2 further comprises a bottom electrode BE in a region predetermined for forming a capacitor CS, and the bottom electrode BE is electrically connected to the source region S1, the drain region D3 and the gate G4, as shown in FIG. 1. Moreover, the second conductive layer M2 may further comprise a data line DL and a power line Vdd. The data line DL is electrically connected to the source region S6, and the power line Vdd is electrically connected to the drain region D2, as shown in FIG. 1, FIG. 2 and FIG. 3C.

The third insulating layer 106 covers the second conductive layer M2. The third insulating layer 106 can be made of an inorganic material (such as silicon oxide, silicon nitride, or silicon oxynitride), an organic material or a stacked layer containing the insulating material and any other insulating material.

The third conductive layer M3 is disposed on the third insulating layer 106. In consideration of electrical conductivity, the third conductive layer M3 is often made of metal materials. However, the invention is not limited thereto. According to other embodiments of the invention, the third conductive layer M3 can also be made of other conductive materials. The metal material includes, for example, an alloy, metal nitride, metal oxide, metal oxynitride, another appropriate material, or a layer in which the metal material and any other conductive material are stacked to each other. According to the embodiment, the layout of the third conductive layer M3 is shown in FIG. 3D, which mainly includes a top electrode TE of the capacitor CS, and the top electrode TE is electrically connected to the power line Vdd through contact via structures V8~V9, as shown in FIG. 3D and FIG. 5. According to the embodiment, the third conductive layer M3 further comprises a conductive pattern E electrically connected to the drain electrode DE5 through a contact via structure V10. The conductive pattern E and the contact via structure V10 are used to electrically connect the drain electrode DE5 and a film layer formed subsequently.

Figure 4:
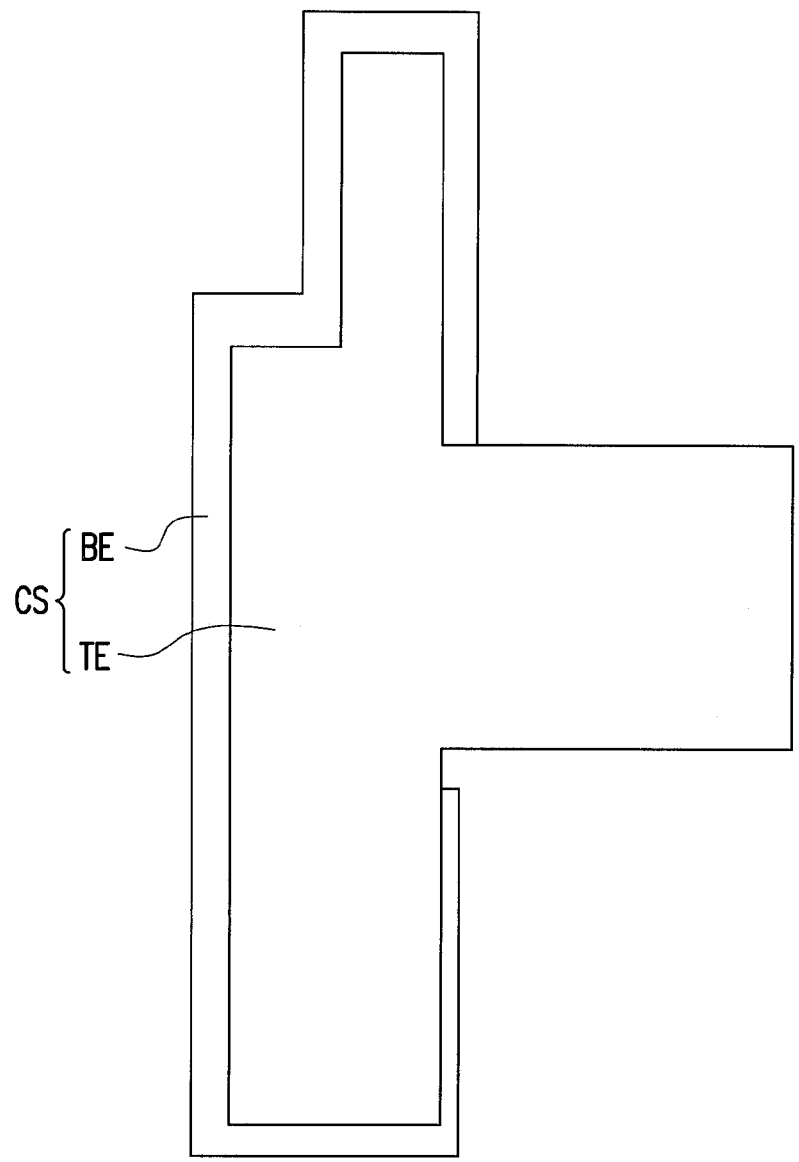
FIG. 4 is a top view showing a capacitor of the pixel structure in FIG. 2.

The capacitor CS in the embodiment is formed with the top electrode TE of the third conductive layer M3, the bottom electrode BE of the second conductive layer M2 and the third insulating layer 106 between the bottom electrode TE and the bottom electrode BE. The layout for the capacitor CS of the pixel structure is as shown in FIG. 4.

The pixel electrode PE is electrically connected to the above thin film transistors. In the embodiment, a planarization layer 110 is disposed on the third insulating layer 106, and the pixel electrode PE is disposed on the planarization layer 110. The pixel electrode PE is electrically connected to the drain electrode DE5 of the fifth thin film transistor T5 through a contact via structure V. For detail, the pixel electrode PE is electrically connected to the conductive pattern E through the contact via structure V, and the conductive pattern E is electrically connected to the drain electrode DE5 through the contact via structure V10, such that the pixel electrode PE can be electrically connected to the drain electrode DE5 of the fifth thin film transistor T5. The pixel electrode PE may be a transparent pixel electrode, a reflective pixel electrode or a transflective pixel electrode.

In the embodiment, the bottom electrode BE and the top electrode TE of the capacitor CS are respectively disposed in the second conductive layer M2 and the third conductive layer M3. The semiconductor layer PO is not used as an electrode for the capacitor CS, and therefore, the capacitor CS can be disposed overlapping with the semiconductor layer PO, so as to reduce an area occupied by components of the pixel structure. Comparing with a conventional 6T1C pixel structure, the pixel structure of the embodiment which using the second conductive layer M2 and the third conductive layer M3 as electrodes of the capacitor CS may save 20~30% area for the pixel structure.

Figure 6:
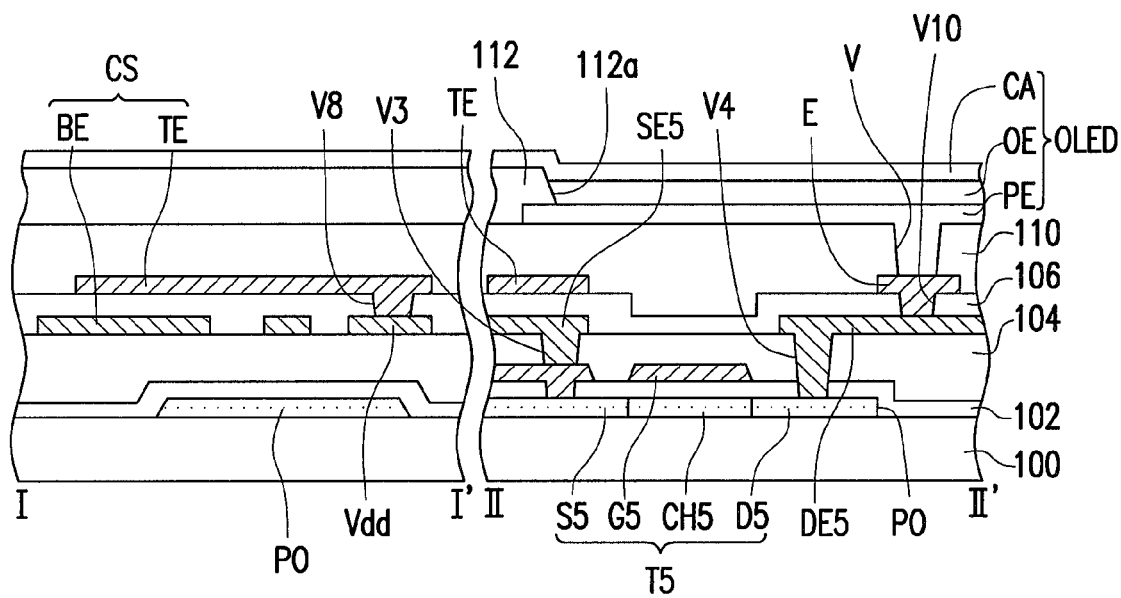
FIG. 6 is a schematic diagram showing forming an organic light emitting device on the pixel structure of FIG. 2.

The pixel structure shown in FIG. 2 and FIG. 5 may be applied in an organic electroluminescence display. FIG. 6 is a schematic diagram showing forming an organic light emitting device on the pixel structure of FIG. 2. Referring to FIG. 6, the pixel structure of the organic electroluminescence display further comprises a light emitting region defining layer 112, a light emitting layer OE and an electrode layer CA, and the pixel electrode PE, the light emitting layer OE and the electrode layer CA form an organic light emitting device OLED.

The light emitting region defining layer 112 is disposed on the pixel electrode PE and has an opening 112a exposing the pixel electrode PE. The light emitting region defining layer 112 can be made of an inorganic material (such as silicon oxide, silicon nitride, or silicon oxynitride), an organic material (e.g., polyester (PET), polyethylene, cycloolefin, polyimide, polyamide, polyalcohols, polyphenylene, polyether, polyketone, any other suitable material, or a combination thereof), any other suitable material, or a combination of the above. The light emitting layer OE is disposed on the pixel electrode PE exposed by the opening 112a of the emitting region defining layer 112. The light emitting layer OE can be, for example, an organic emitting layer including a red organic emitting pattern, a green organic emitting pattern and a blue organic emitting pattern, or the other emitting patterns with the colors (such as white, orange, purple, etc.) generated by combining various light spectrums. The electrode layer CA is disposed on the light emitting layer OE and comprises an electrode material having a suitable work function related to the light emitting layer OE.

The pixel structure of FIG. 6 is a pixel structure in an organic electroluminescence display, which should not be construed as a limitation to the invention. According to another embodiment, the configuration of that the bottom electrode BE and the top electrode TE of the capacitor CS are respectively disposed in the second conductive layer M2 and the third conductive layer M3 may also be applied to a liquid crystal display, an electrophoretic display, an electro-wetting display or other suitable displays.

Figure 7:
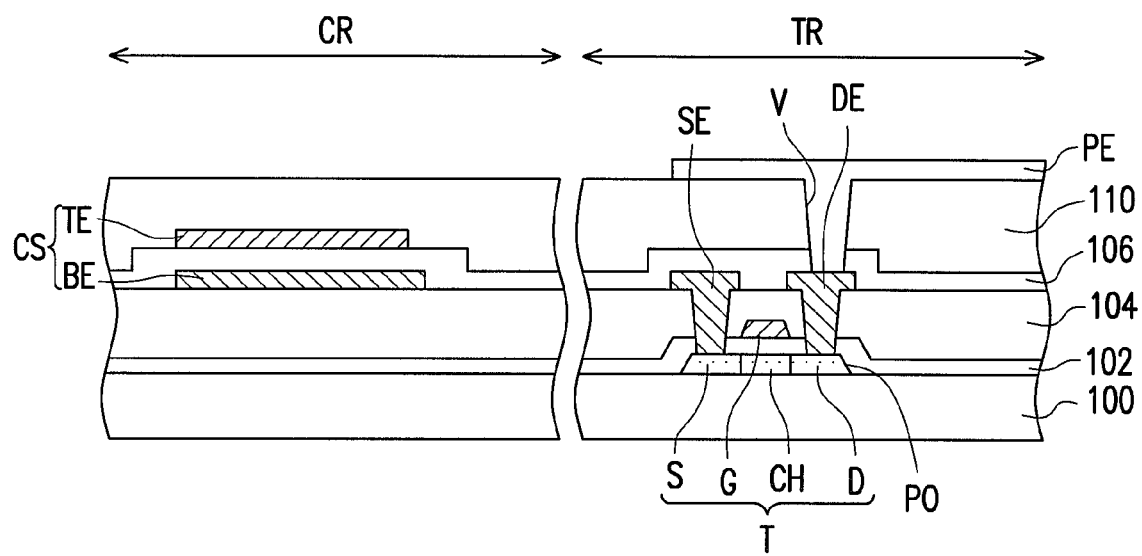
FIG. 7 is schematic cross-sectional diagram showing a pixel structure according to an embodiment of the invention.

FIG. 7 is schematic cross-sectional diagram showing a pixel structure according to an embodiment of the invention. The embodiment depicted in FIG. 7 is similar to the embodiment depicted in FIG. 5, and the same components indicated in FIG. 5 are denoted by the same numerals and are not repeated herein. With reference to FIG. 7, the pixel structure is disposed on the substrate 100, and the substrate 100 includes a capacitor region CR and a transistor region TR.

The pixel structure comprises a thin film transistor T, a capacitor CS and a pixel electrode PE.

The thin film transistor T is disposed in the transistor region TR and includes a semiconductor layer PO, a gate G, a source electrode SE and a drain electrode DE. The semiconductor layer PO includes a source region S, a drain region D and a channel region CH. A first insulating layer 102 covers the semiconductor layer PO. The gate G is disposed on the insulating layer 102 above the channel region CH of the semiconductor layer PO. A second insulating layer 104 covers the gate G. The source electrode SE and the drain electrode DE are disposed on the second insulating layer 104 and electrically connected to the source region S and the drain region D respectively.

The capacitor CS is disposed in the capacitor region CR and includes a bottom electrode BE and a top electrode TE. The bottom electrode BE is disposed on the second insulating layer 104, the top electrode TE is disposed on the third insulating layer 106, and the third insulating layer 106 between the bottom electrode BE and the top electrode TE serves as a capacitor dielectric layer. The storage capacitance of the capacitor CS may be adjusted by selecting a specific capacitor dielectric material or adjusting a thickness of the capacitor dielectric layer. For example, when a thinner capacitor dielectric layer is formed, an area occupied by the capacitor CS can be reduced on the premise that a predetermined capacitance is maintained, such that the display may have high resolution. Furthermore, the semiconductor layer PO may be disposed under the capacitor CS (not shown) to increase the design convenience, which should not be construed as a limitation to the invention.

It is noted that in the thin film transistor T and the capacitor CS of the embodiment, the gate G of the thin film transistor T belongs to the first conductive layer; the source electrode SE and the drain electrode DE of the thin film transistor T and the bottom electrode BE of the capacitor CS belong to the second conductive layer; and the top electrode TE of the capacitor CS belongs to the third conductive layer.

In addition, a planarization layer 110 may also be disposed on the third insulating layer 106, and the pixel electrode PE is disposed on the planarization layer 110. The pixel electrode PE is electrically connected to the drain electrode DE of the thin film transistor T through the contact via structure V.

In pixel structure of the embodiment, the bottom electrode BE and the top electrode TE of the capacitor CS are respectively disposed in the second conductive layer and the third conductive layer. Herein, the semiconductor layer PO is not used as an electrode for the capacitor CS, and therefore, the capacitor CS can be disposed overlapping with the semiconductor layer PO, so as to reduce an area occupied by components of the pixel structure.

Second Embodiment

Figure 8:
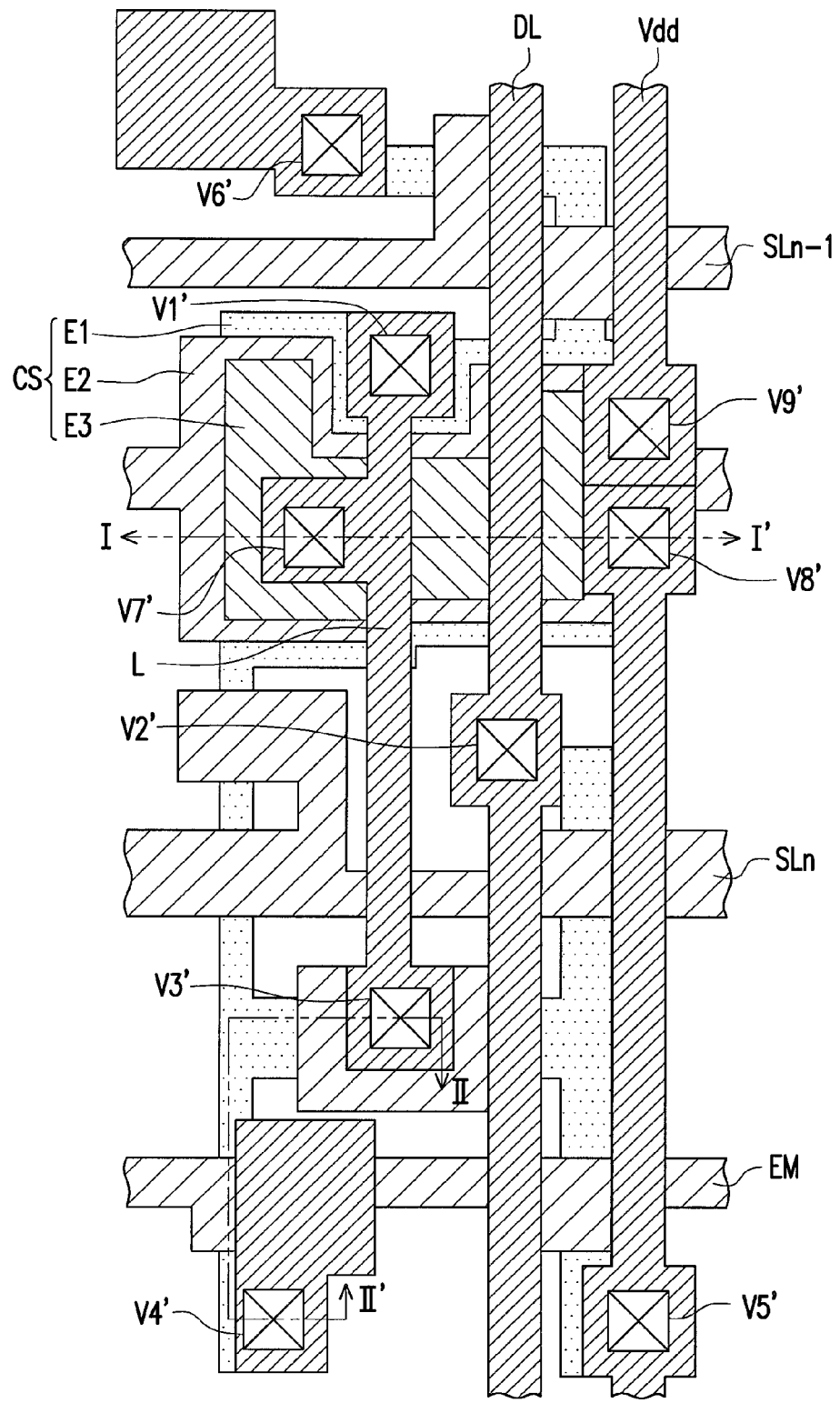
FIG. 8 is a top view showing a pixel structure according to an embodiment of the invention.
Figure 9A:
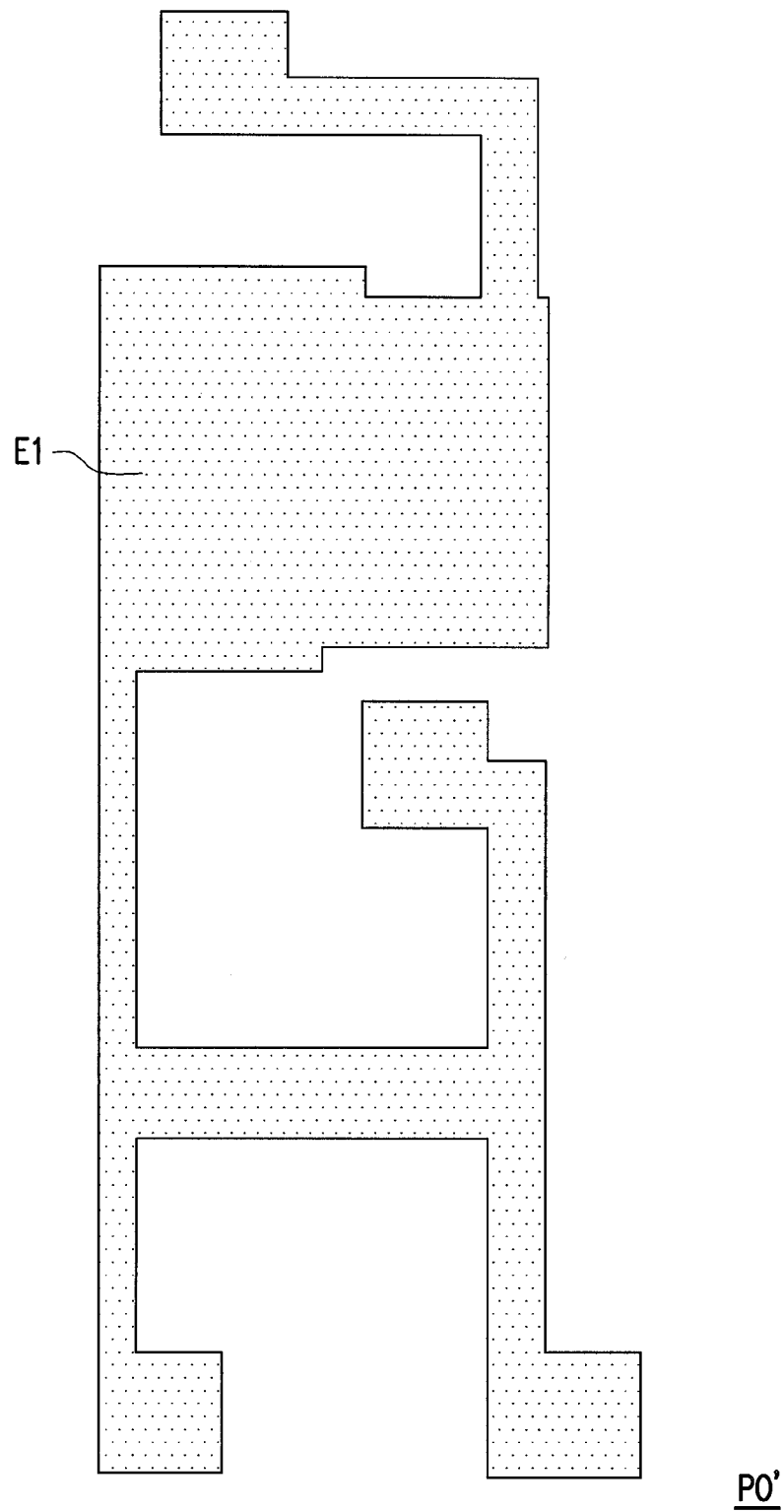
FIG. 9A is a top view showing a semiconductor layer of the pixel structure in FIG. 8.
Figure 9B:
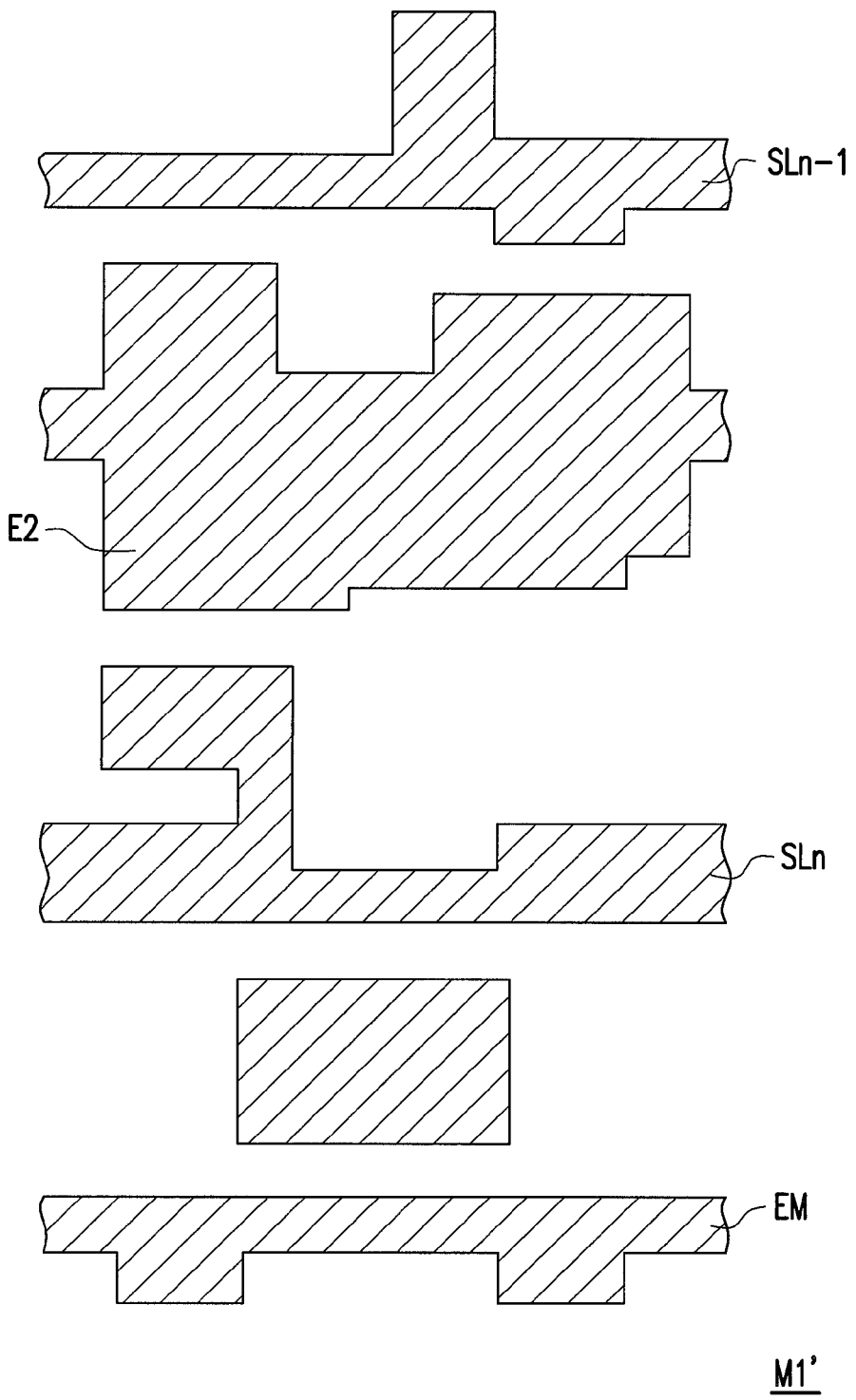
FIG. 9B is a top view showing a first conductive layer of the pixel structure in FIG. 8.
Figure 9C:
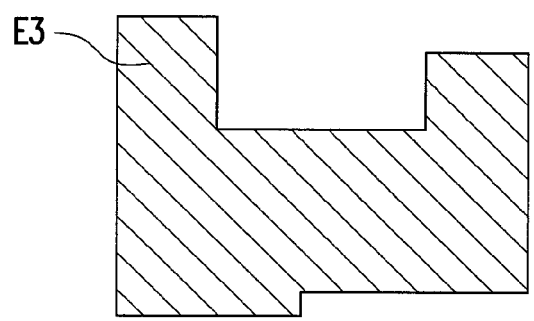
FIG. 9C is a top view showing a second conductive layer of the pixel structure in FIG. 8.
Figure 9D:
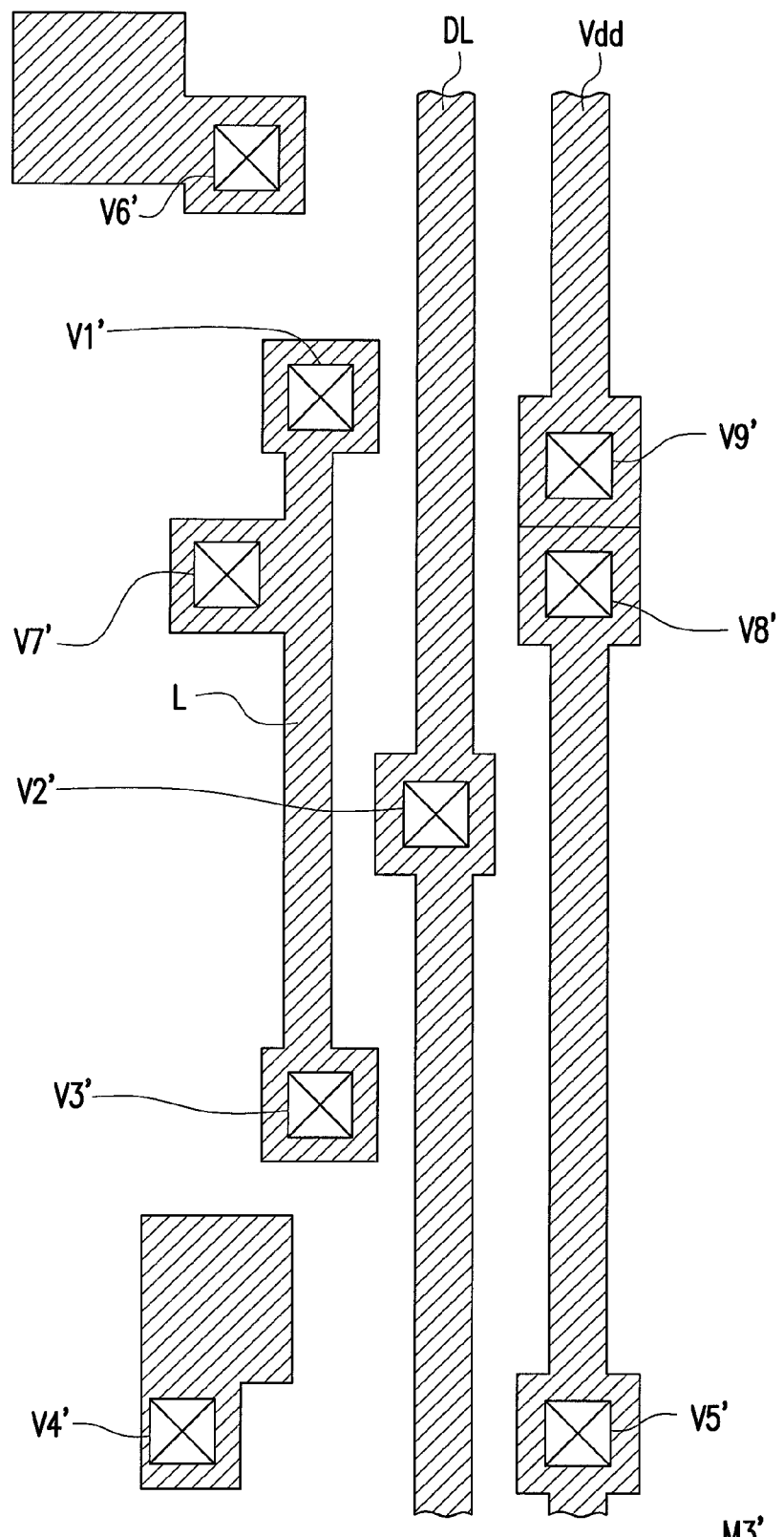
FIG. 9D is a top view showing a third conductive layer of the pixel structure in FIG. 8.
Figure 10:
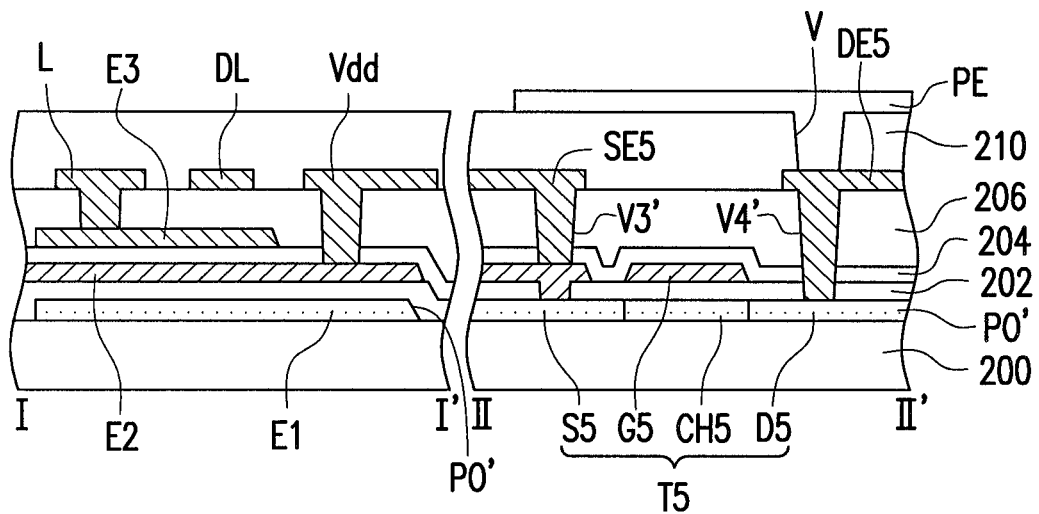
FIG. 10 is schematic cross-sectional diagram along the cross-sectional line I-I' and the cross-sectional line II-II' in FIG. 8.

FIG. 1 is a schematic circuit diagram of a pixel structure according to an embodiment of the invention. FIG. 8 is a top view showing a pixel structure according to an embodiment of the invention. FIG. 9A is a top view showing a semiconductor layer of the pixel structure in FIG. 8. FIG. 9B is a top view showing a first conductive layer of the pixel structure in FIG. 8. FIG. 9C is a top view showing a second conductive layer of the pixel structure in FIG. 8. FIG. 9D is a top view showing a third conductive layer of the pixel structure in FIG. 8. FIG. 10 is schematic cross-sectional diagram along the cross-sectional line I-I' and the cross-sectional line II-II' in FIG. 8.

Referring to FIG. 1, FIG. 8, FIG. 9A, FIG. 9B, FIG. 9C, FIG. 9D and FIG. 10, the pixel structure is disposed on a substrate 200 and comprises a semiconductor layer PO', a first insulating layer 202, a first conductive layer, M1' a second insulating layer 2104, a second conductive layer M2', a third insulating layer 206, a third conductive layer M3' and a pixel electrode PE. In the embodiment, the pixel structure is a structure comprising six thin film transistors and one capacitor (6T1C), which should not be construed as a limitation to the invention. According to another embodiment, the pixel structure may also be a 1T1C structure, a 2T1C structure or other structure with a specific number of transistor and a specific number of capacitor, and the pixel structure can be applied to an organic electroluminescence display, a liquid crystal display, an electrophoretic display, an electro-wetting display or other suitable displays. In addition, the cross-sectional diagram of FIG. 10 is a cross-sectional view for the fifth thin film transistor in the 6T1C pixel structure. Since the six thin film transistors in the 6T1C pixel structure are substantially similar, the people skilled in the art may understand the cross-sectional structures of other five thin film transistors in accordance with the description for the fifth thin film transistor shown in FIG. 10.

The material of the substrate 200 is similar to or the same with the material of the substrate 100 as described in the first embodiment.

The semiconductor layer PO' is disposed on the substrate 200 and has a material similar to or the same with the material of the semiconductor layer PO as described in the first embodiment. The semiconductor layer PO' comprises at least one source region, at least one drain region and at least one first electrode, and a region between the source region and the drain region is a channel region. According to the embodiment, the layout of the semiconductor layer PO' is shown in FIG. 9A, and the semiconductor layer PO' mainly comprises channel regions, source regions and drain regions of the six thin film transistors and a first electrode E1 of a capacitor. For instance, the semiconductor layer PO' has a source region S5, a drain region D5 and a channel region CH5 in a region predetermined for forming a fifth thin film transistor T5.

Similarly, the semiconductor layer PO' has a source region S1, a drain region D1 and a channel region (not shown) in a region predetermined for forming a first thin film transistor T1; the semiconductor layer PO' has a source region S2, a drain region D2 and a channel region (not shown) in a region predetermined for forming a second thin film transistor T2; the semiconductor layer PO' has a source region S3, a drain region D3 and a channel region (not shown) in a region predetermined for forming a third thin film transistor T3; the semiconductor layer PO' has a source region S4, a drain region D4 and a channel region (not shown) in a region predetermined for forming a fourth thin film transistor T4; and the semiconductor layer PO' has a source region S6, a drain region D6 and a channel region (not shown) in a region predetermined for forming a sixth thin film transistor T6.

The first insulating layer 202 covers the semiconductor layer PO' and has a material similar to or the same with the material of the first insulating layer 102 as described in the first embodiment.

The first conductive layer M1' is disposed on the first insulating layer 202 and has a material similar to or the same with the material of the first conductive layer M1 as described in the first embodiment. According to the embodiment, the layout of the first conductive layer M1' is shown in FIG. 9B, which mainly comprises gates of the six thin film transistors and a second electrode E2 of the capacitor CS. For example, the first conductive layer M1' has a gate G5 in the region predetermined for forming the fifth thin film transistor T5, as shown in FIG. 10.

Similarly, the first conductive layer M1' has a gate G1 in the region predetermined for forming the first thin film transistor T1; the first conductive layer M1' has a gate G2 in the region predetermined for forming the second thin film transistor T2; the first conductive layer M1' has a gate G3 in the region predetermined for forming the third thin film transistor T3; the first conductive layer M1' has a gate G4 in the region predetermined for forming the fourth thin film transistor T4; and the first conductive layer M1' has a gate G6 in the region predetermined for forming the sixth thin film transistor T6. In addition, the first conductive layer M1' further comprises a scan line SLn, a scan line SLn-1 and a light emitting signal line EM, wherein the scan line SLn is electrically connected to the gate G3, the scan line SLn-1 is electrically connected to the gate G1, and the light emitting signal line EM is electrically connected to the gates G5, G2. Moreover, the first conductive layer M1' further comprises a second electrode E2 in a region predetermined for forming the capacitor CS, and the second electrode E2 is disposed above the first electrode E1.

The second insulating layer 204 covers the first conductive layer M1' and has a material similar to or the same with the material of the second insulating layer 104 as described in the first embodiment.

The second conductive layer M2' is disposed on the second insulating layer 204 and has a material similar to or the same with the material of the second conductive layer M2' as described in the first embodiment. According to the embodiment, the layout of the second conductive layer M2' is shown in FIG. 9C, which mainly comprises a third electrode E3 of the capacitor CS, and the third electrode E3 is disposed above the second electrode E2 of the first conductive layer M1', as shown in FIG. 10. Hence, the capacitor CS is formed with the first electrode E1 of the semiconductor layer PO', the second electrode E2 of the first conductive layer M1' and the third electrode E3 of the second conductive layer M2', and the first insulating layer 202 between the first electrode E1 of the semiconductor layer PO' and the second electrode E2 of the first conductive layer M1' and the second insulating layer 204 between the second electrode E2 of the first conductive layer M1' and the third electrode E3 of the second conductive layer M2' serve as capacitor dielectric layers of the capacitor CS.

The third insulating layer 206 covers the second conductive layer M2' and has a material similar to or the same with the material of the third insulating layer 106 as described in the first embodiment.

The third conductive layer M3' is disposed on the third insulating layer 206 and has a material similar to or the same with the material of the third conductive layer M3 as described in the first embodiment. According to the embodiment, the layout of the third conductive layer M3' is shown in FIG. 9D, which mainly comprises source electrodes and drain electrodes of the six thin film transistors. For example, the third conductive layer M3' has a source electrode SE5 and a drain electrode DE5 in the region predetermined for forming the fifth thin film transistor T5, the source electrode SE5 and the drain electrode DE5 are electrically connected to the source region S5 and the drain region D5 respectively, and the source region S5, the drain region D5, the source electrode SE5, the drain electrode DE5 and the gate G5 form the fifth thin film transistor T5.

Similarly, the third conductive layer M3' has a source electrode and a drain electrode (not shown) in the region predetermined for forming the first thin film transistor T1, the source electrode and the drain electrode are electrically connected to the source region S1 and the drain region D1 respectively, and the source region S1, the drain region D1, the source electrode, the drain electrode and the gate G1 form the first thin film transistor T1. The third conductive layer M3' has a source electrode and a drain electrode (not shown) in the region predetermined for forming the second thin film transistor T2, the source electrode and the drain electrode are electrically connected to the source region S2 and the drain region D2 respectively, and the source region S2, the drain region D2, the source electrode, the drain electrode and the gate G2 form the second thin film transistor T2. The third conductive layer M3' has a source electrode and a drain electrode (not shown) in the region predetermined for forming the third thin film transistor T3, the source electrode and the drain electrode are electrically connected to the source region S3 and the drain region D3 respectively, and the source region S3, the drain region D3, the source electrode, the drain electrode and the gate G3 form the third thin film transistor T3. The third conductive layer M3' has a source electrode and a drain electrode (not shown) in the region predetermined for forming the fourth thin film transistor T4, the source electrode and the drain electrode are electrically connected to the source region S4 and the drain region D4 respectively, and the source region S4, the drain region D4, the source electrode, the drain electrode and the gate G4 form the third thin film transistor T4. The third conductive layer M3' has a source electrode and a drain electrode (not shown) in the region predetermined for forming the sixth thin film transistor T6, the source electrode and the drain electrode are electrically connected to the source region S6 and the drain region D6 respectively, and the source region S6, the drain region D6, the source electrode, the drain electrode and the gate G6 form the sixth thin film transistor T6. The above source electrodes and the drain electrodes are electrically connected to the source region and the drain regions through contact via structures V1'~V6'.

Besides, the third conductive layer M3' further comprises a data line DL and a power line Vdd. The data line DL is electrically connected to the source region S6, and the power line Vdd is electrically connected to the drain region D2. Moreover, the power line Vdd is electrically connected to the second electrode E2 of the capacitor CS through contact via structures V8'~V9'. The third conductive layer M3' may further comprise a signal line L, and the third electrode E3 of the capacitor CS is electrically connected to the signal line L through a contact via structure V7'.

The pixel electrode PE is electrically connected to the above thin film transistors. In the embodiment, a planarization layer 210 is disposed on the third insulating layer 206, and the pixel electrode PE is disposed on the planarization layer 210. The pixel electrode PE is electrically connected to the drain electrode DE5 of the fifth thin film transistor T5 through a contact via structure V. The pixel electrode PE may be a transparent pixel electrode, a reflective pixel electrode or a transflective pixel electrode.

In the pixel structure of the embodiment, the capacitor CS is formed with the first electrode E1 of the semiconductor layer PO', the second electrode E2 of the first conductive layer M1' and the third electrode E3 of the second conductive layer M2'. Namely, the capacitor CS is formed by three conductive layers. An area occupied by the capacitor CS can be reduced on the premise that a predetermined storage capacitance is maintained so as to reduce an overall area of the pixel structure. Comparing with a conventional 6T1C pixel structure, the pixel structure of the embodiment having the capacitor CS using three conductive layers may save 20% area for the pixel structure.

Figure 11:
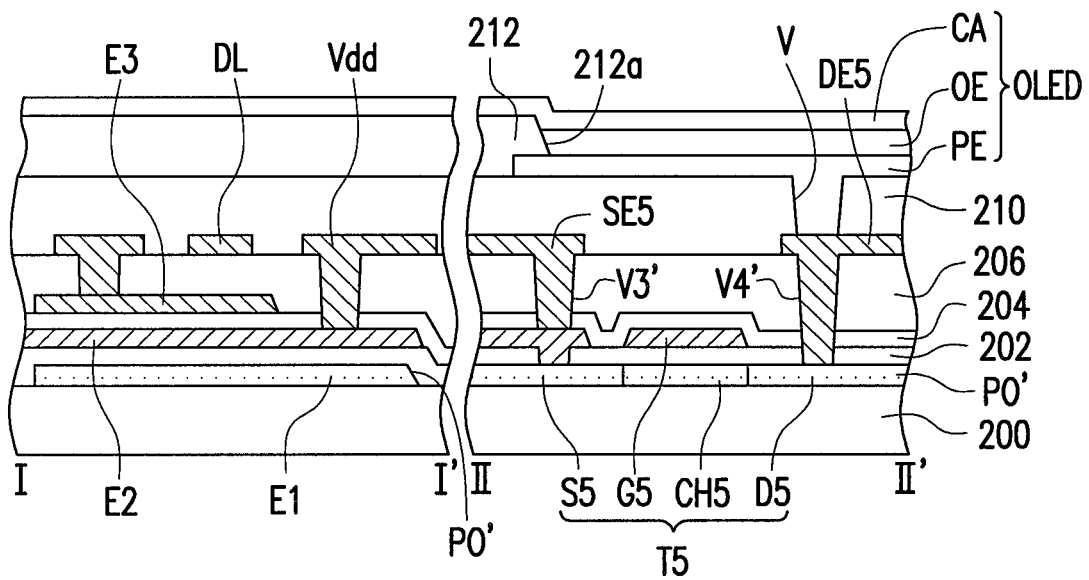
FIG. 11 is a schematic diagram showing forming an organic light emitting device on the pixel structure of FIG. 8.

If the pixel structure is applied to an organic electroluminescence display, the pixel structure further comprises a light emitting region defining layer 212, a light emitting layer OE and an electrode layer CA, as shown in FIG. 11. The pixel electrode PE, the light emitting layer OE and the electrode layer CA form an organic light emitting device OLED.

The light emitting region defining layer 212 is disposed on the pixel electrode PE and has an opening 212a to expose the pixel electrode PE. The light emitting region defining layer 212 has a material the same or similar to the material of the light emitting region defining layer 112 as described in the first embodiment. The light emitting layer OE is disposed on the pixel electrode PE exposed by the opening 212a of the emitting region defining layer 212. The light emitting layer OE can be, for example, an organic emitting layer including a red organic emitting pattern, a green organic emitting pattern and a blue organic emitting pattern, or the other emitting patterns with the colors (such as white, orange, purple, etc.) generated by combining various light spectrums. The electrode layer CA is disposed on the light emitting layer OE, and a material of electrode layer CA comprises an electrode material having a suitable work function based on the light emitting layer OE.

The pixel structure of FIG. 11 is applied in an organic electroluminescence display, which should not be construed as a limitation to the invention. According to another embodiment, the capacitor CS formed with the first electrode E1 of the semiconductor layer PO', the second electrode E2 of the first conductive layer M1' and the third electrode E3 of the second conductive layer M2' may also be applied to a liquid crystal display, an electrophoretic display, an electro-wetting display or other suitable displays.

Figure 12:
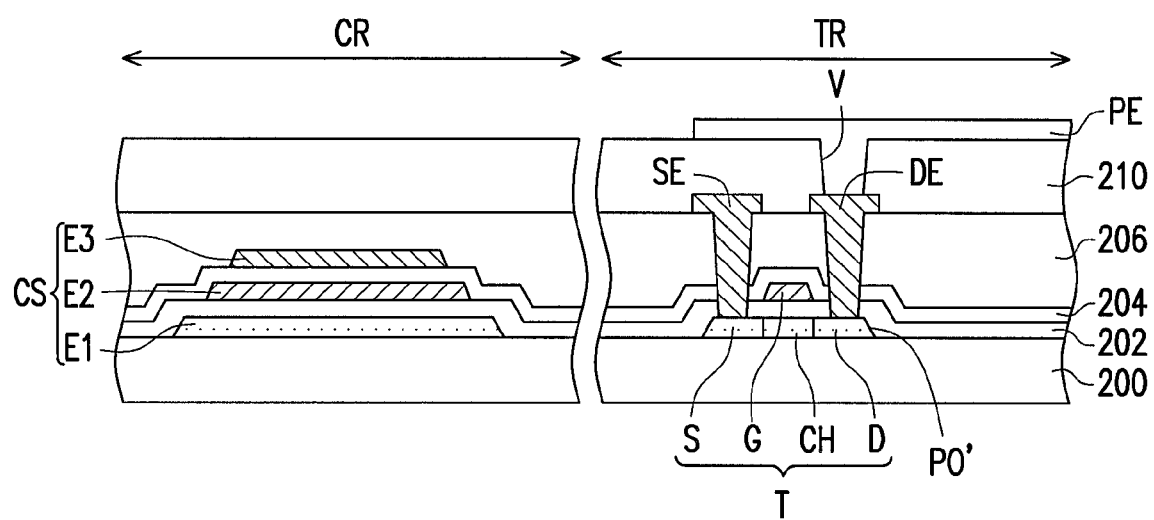
FIG. 12 is schematic cross-sectional diagram showing a pixel structure according to an embodiment of the invention.

FIG. 12 is schematic cross-sectional diagram showing a pixel structure according to an embodiment of the invention. The embodiment depicted in FIG. 12 is similar to the embodiment depicted in FIG. 11, and the same components indicated in FIG. 11 are denoted by the same numerals and are not repeated herein. With reference to FIG. 12, the pixel structure is disposed on the substrate 200, and the substrate 200 includes a capacitor region CR and a transistor region TR. The pixel structure comprises a thin film transistor T, a capacitor CS and a pixel electrode PE.

The thin film transistor T is disposed in the transistor region TR and includes a semiconductor layer PO', a gate G, a source electrode SE and a drain electrode DE. The semiconductor layer PO' includes a source region S, a drain region D and a channel region CH. A first insulating layer 202 covers the semiconductor layer PO'. The gate G is disposed on the insulating layer 202 above the channel region CH of the semiconductor layer PO'. A second insulating layer 204 and the third insulating layer 206 cover the gate G. The source electrode SE and the drain electrode DE are disposed on the third insulating layer 206 and electrically connected to the source region S and the drain region D respectively.

The capacitor CS is disposed in the capacitor region CR and includes a first electrode E1, a second electrode E2 and a third electrode E3. The first electrode E1 is disposed on the substrate 200, the second electrode E2 is disposed on the first insulating layer 202, and the third electrode E3 is disposed on the second insulating layer 204. The first insulating layer 202 between the first electrode E1 and the second electrode E2 and the second insulating layer 204 between the second electrode E2 and the third electrode E3 serve as capacitor dielectric layers of the capacitor CS.

In is noted that, in the thin film transistor T and the capacitor CS of the embodiment, the first electrode E1 of the capacitor and the semiconductor layer PO' (the source region S, the drain region D and the channel region CH) are in the same film layer. The gate G of the thin film transistor T and the second electrode E2 of the capacitor CS are in the same film layer (a first conductive layer). The third electrode E3 of the capacitor CS belongs to a second conductive layer. The source electrode SE and the drain electrode DE of the thin film transistor T belongs to a third conductive layer.

In addition, a planarization layer 210 may also be disposed on the third insulating layer 206, and the pixel electrode PE is disposed on the planarization layer 210. The pixel electrode PE is electrically connected to the drain electrode DE of the thin film transistor T through the contact via structure V.

In the pixel structure of the embodiment, the capacitor CS is formed with the first electrode E1 of the semiconductor layer PO', the second electrode E2 of the first conductive layer M1' and the third electrode E3 of the second conductive layer M2'. An area occupied by the capacitor CS can be reduced on the premise that a predetermined storage capacitance is maintained, such that an overall area of the pixel structure is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure, comprising:
    a semiconductor layer, comprising at least one source region and at least one drain region;
    a first insulating layer, covering the semiconductor layer;
    a first conductive layer, disposed on the first insulating layer and comprising at least one gate;
    a second insulating layer, covering the first conductive layer;
    a second conductive layer, disposed on the second insulating layer and comprising at least one source electrode, at least one drain electrode and at least one bottom electrode, wherein the at least one source electrode and the at least one drain electrode are electrically connected to the at least one source region and the at least one drain region of the semiconductor layer, respectively, and the at least one source region, the at least one source electrode, the at least one drain region, the at least one drain electrode and the at least one gate form at least one thin film transistor;
    a third insulating layer, covering the second conductive layer;
    a third conductive layer, disposed on the third insulating layer and comprising at least one top electrode, wherein the at least one top electrode of the third conductive layer and the at least one bottom electrode of the second conductive layer form at least one capacitor; and
    a pixel electrode, disposed above the third conductive layer and electrically connected to the at least one thin film transistor.

2. The pixel structure as claimed in claim 1, further comprising a planarization layer covering the third conductive layer, and the pixel electrode is disposed on the planarization layer.

3. The pixel structure as claimed in claim 1, further comprising:
    a light emitting region defining layer, disposed on the pixel electrode and having an opening exposing the pixel electrode;
    a light emitting layer, disposed on the pixel electrode exposed by the opening; and
    an electrode layer, disposed on the light emitting layer.

4. The pixel structure as claimed in claim 1, wherein the at least one thin film transistor comprises six thin film transistors.

* * * * *